(12) United States Patent
Shin et al.

(10) Patent No.: US 11,700,716 B2
(45) Date of Patent: Jul. 11, 2023

(54) DISPLAY DEVICE

(71) Applicant: Samsung Display Co., Ltd., Yongin-si (KR)

(72) Inventors: Jaiku Shin, Hwaseong-si (KR); Jeongil Yoo, Seoul (KR); Sung Chul Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/666,427

(22) Filed: Feb. 7, 2022

(65) Prior Publication Data

US 2022/0322583 A1 Oct. 6, 2022

(30) Foreign Application Priority Data

Mar. 30, 2021 (KR) .................. 10-2021-0040831

(51) Int. Cl.
*H05K 7/20* (2006.01)
*H05K 5/00* (2006.01)

(52) U.S. Cl.
CPC ....... *H05K 7/20963* (2013.01); *H05K 5/0017* (2013.01)

(58) Field of Classification Search
CPC ...... G06F 1/1616; G06F 1/203; G06F 1/1652; G06F 1/1637; G06F 9/301; G06F 3/0412; G06F 2203/04102; H05K 7/20954; H05K 7/20963; H05K 7/0017
See application file for complete search history.

(56) References Cited

U.S. PATENT DOCUMENTS

| | | | |
|---|---|---|---|
| 9,961,809 B1 * | 5/2018 | Yoon | H01L 23/3735 |
| 10,515,570 B2 | 12/2019 | Ha et al. | |
| 2009/0059535 A1 | 3/2009 | Kim et al. | |
| 2016/0357052 A1 * | 12/2016 | Kim | H10K 50/84 |
| 2019/0334114 A1 * | 10/2019 | Park | G06F 1/203 |
| 2020/0019212 A1 * | 1/2020 | Jung | G06F 1/1652 |
| 2020/0022267 A1 * | 1/2020 | Han | B32B 27/065 |
| 2020/0245501 A1 * | 7/2020 | Wu | G09F 9/301 |

(Continued)

FOREIGN PATENT DOCUMENTS

| | | |
|---|---|---|
| KR | 10-2007-0005971 | 1/2007 |
| KR | 10-2016-0070243 | 6/2016 |

(Continued)

*Primary Examiner* — Abhishek M Rathod
(74) *Attorney, Agent, or Firm* — H.C. Park & Associates, PLC

(57) ABSTRACT

A display device includes a display panel, a first support member, a second support member, a first heat dissipation member, and a first coating film. The display panel has a foldable area. The first support member is disposed on a lower surface of the display panel and includes a stretchable portion overlapping the foldable area. The second support member is disposed on a lower surface of the first support member and includes a first support plate and a second support plate spaced apart from each other. The first heat dissipation member is disposed between the first support member and the second support member and includes a first heat dissipation layer and a second heat dissipation layer spaced apart from each other. The first coating film is disposed between the first support member and the first heat dissipation member and includes carbon nanotube.

15 Claims, 10 Drawing Sheets

(56) References Cited

U.S. PATENT DOCUMENTS

2020/0260596 A1* 8/2020 Park .................. B32B 3/04
2020/0314513 A1 10/2020 Park et al.
2020/0401187 A1* 12/2020 Noh .................. G06F 1/1684
2021/0068276 A1* 3/2021 Kim .................. G06F 1/1681

FOREIGN PATENT DOCUMENTS

KR  10-2019-0101516  9/2019
KR  10-2020-0115791  10/2020

* cited by examiner

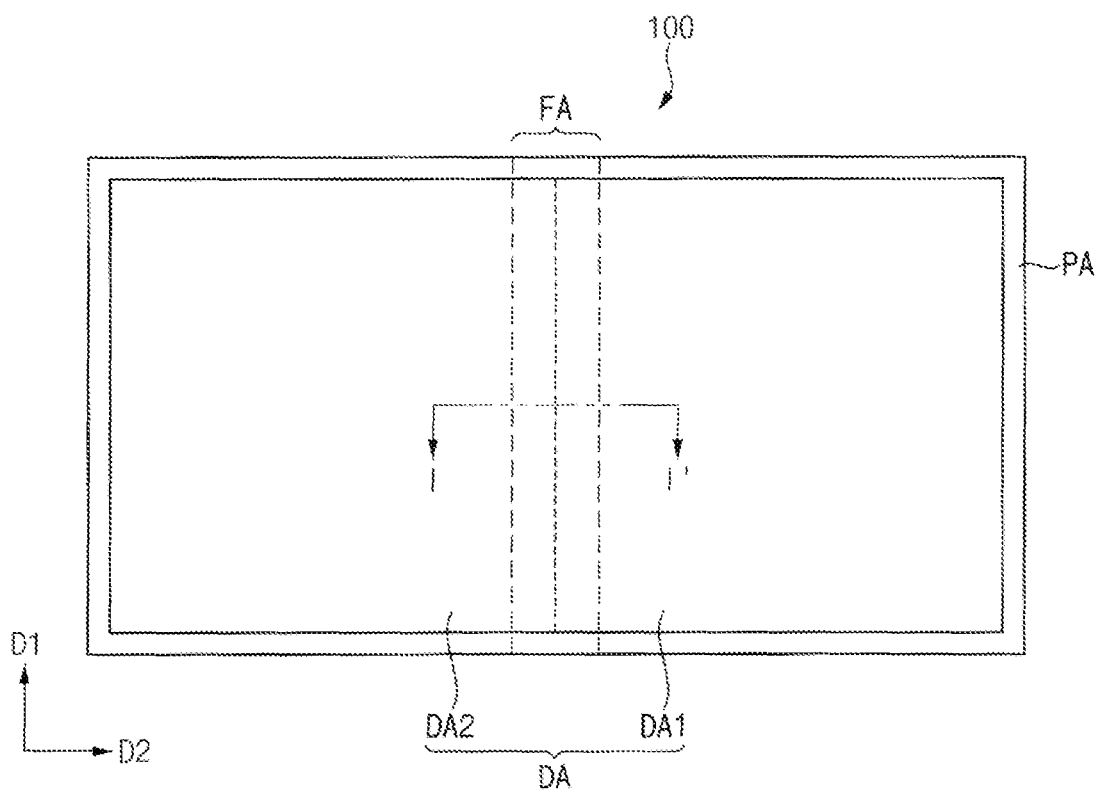
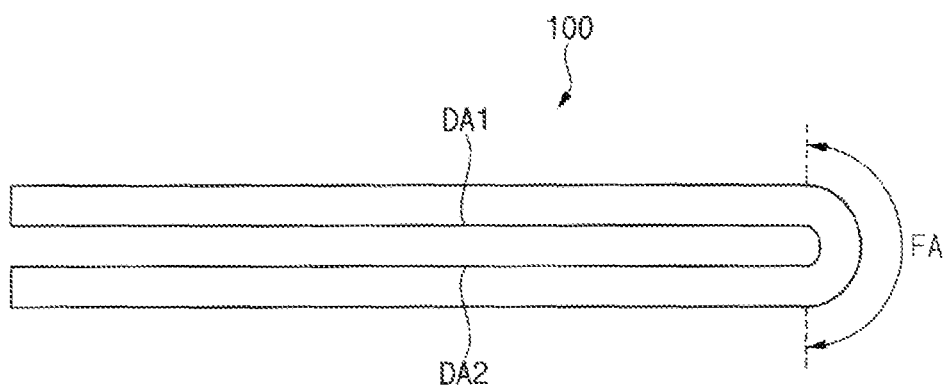

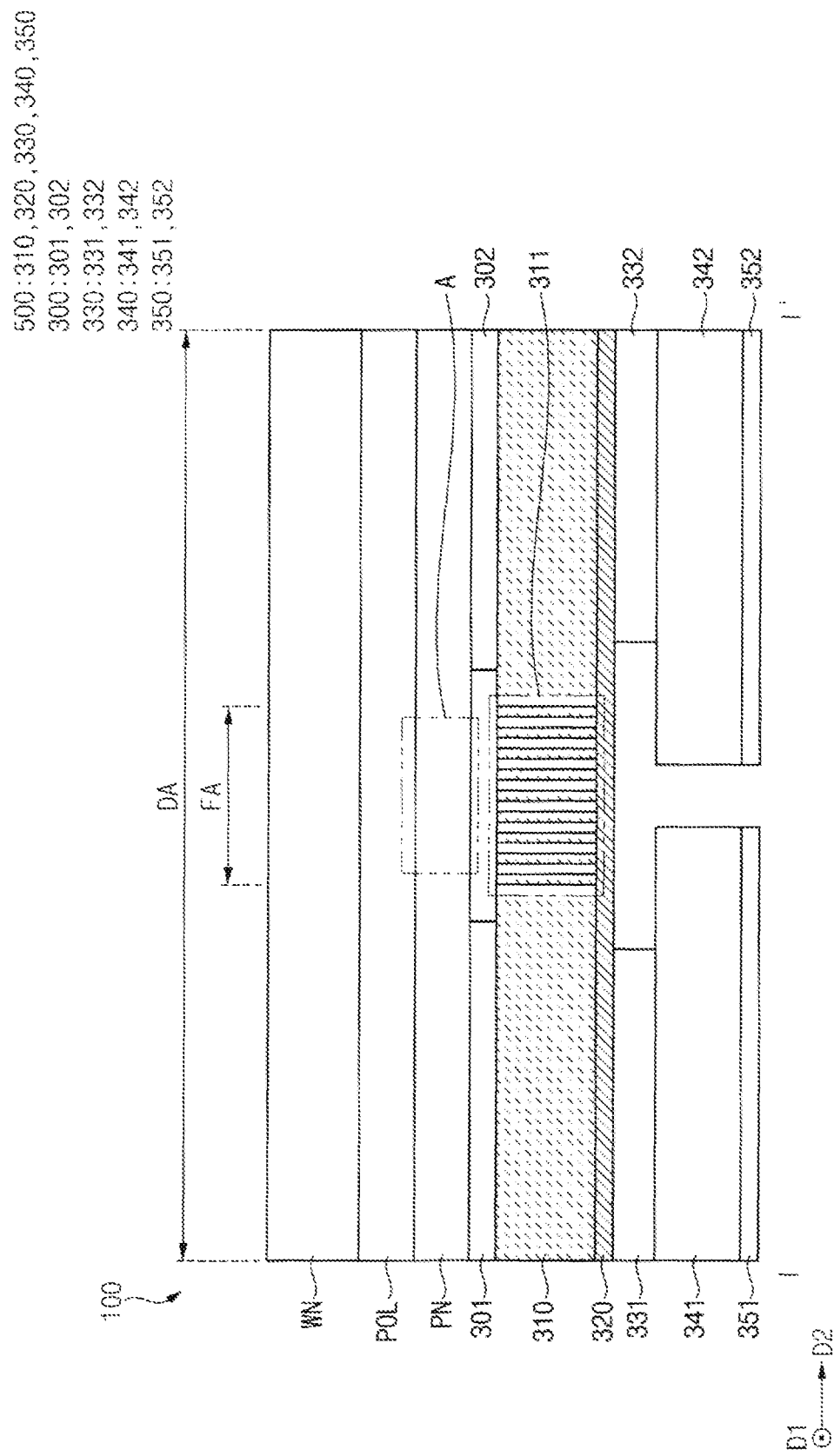

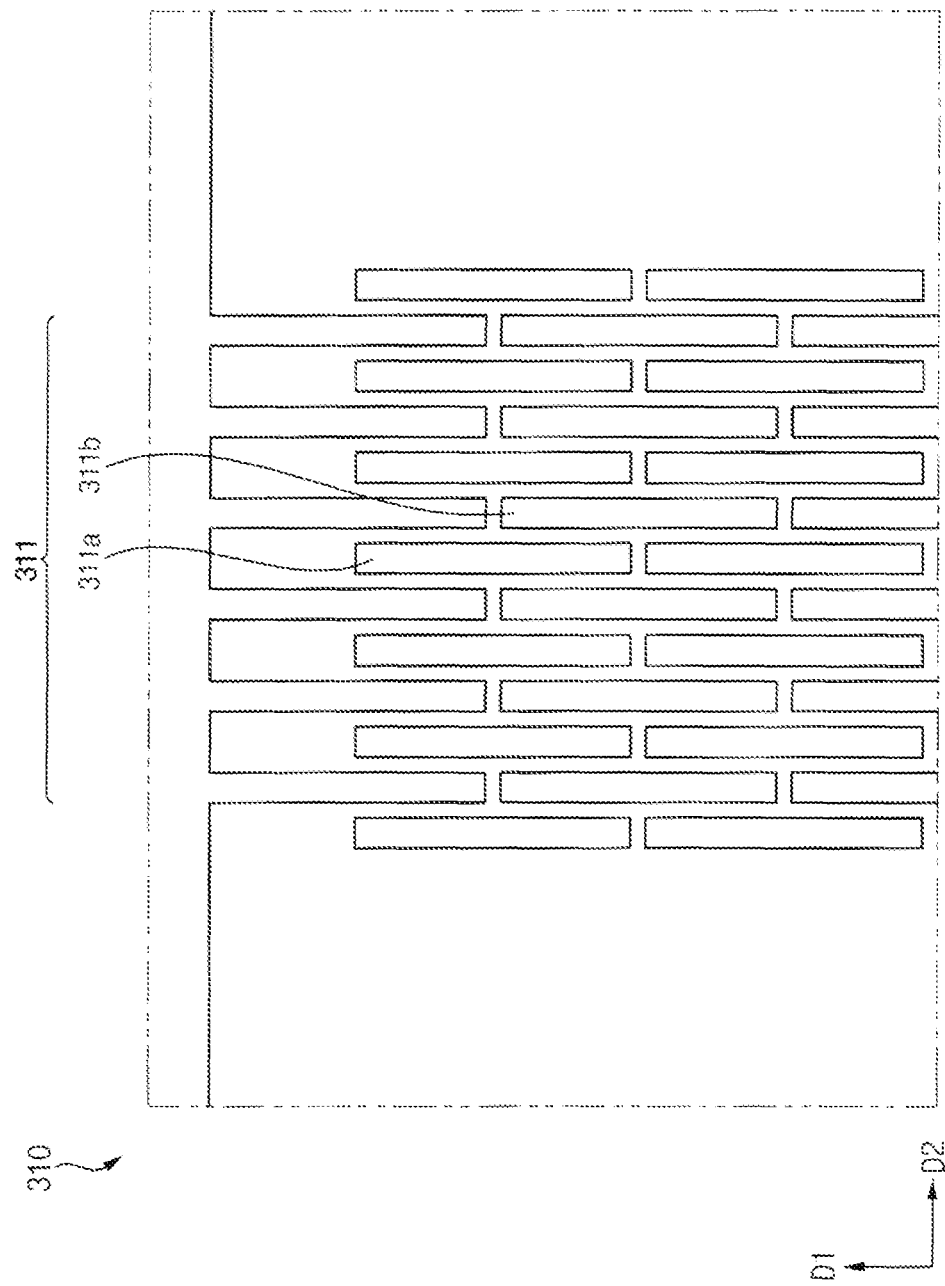

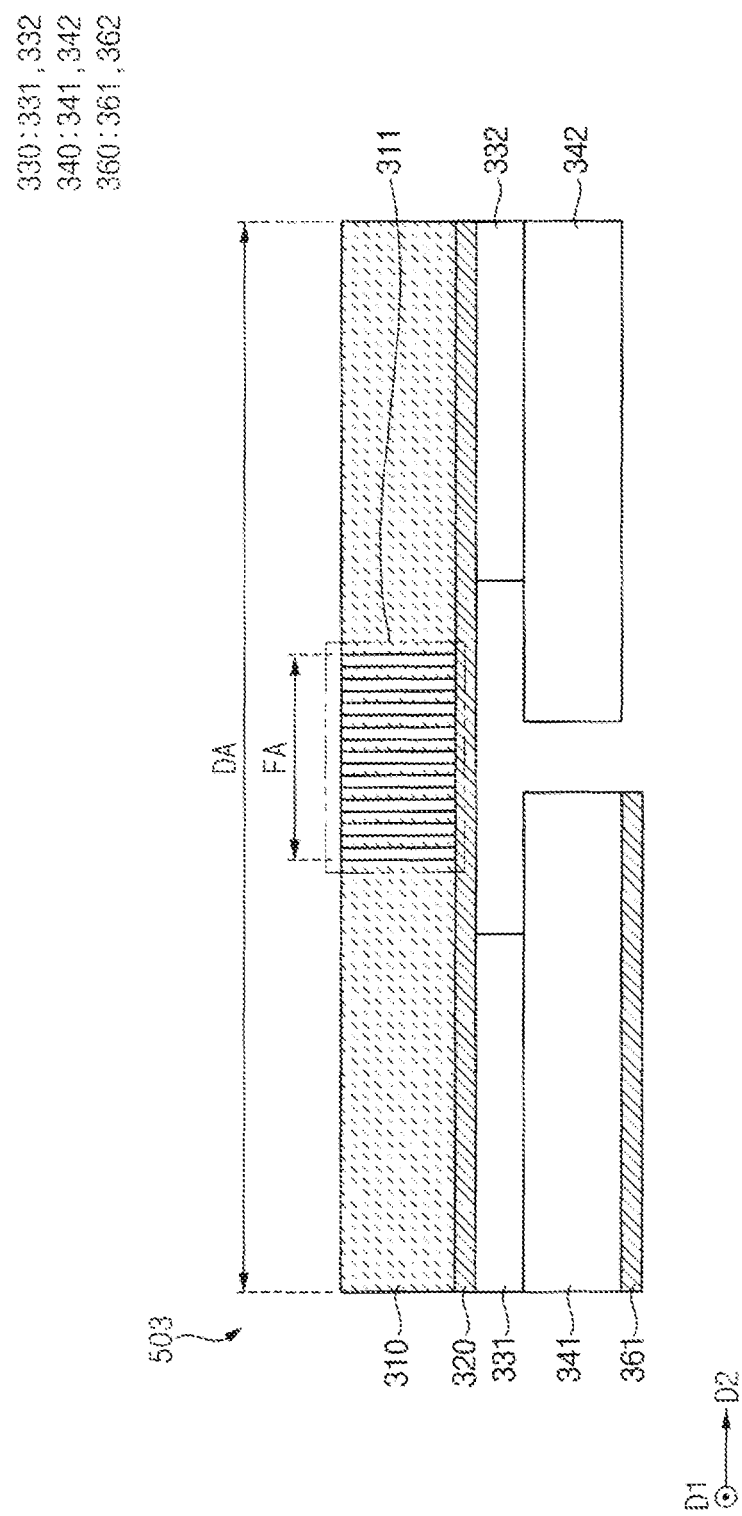

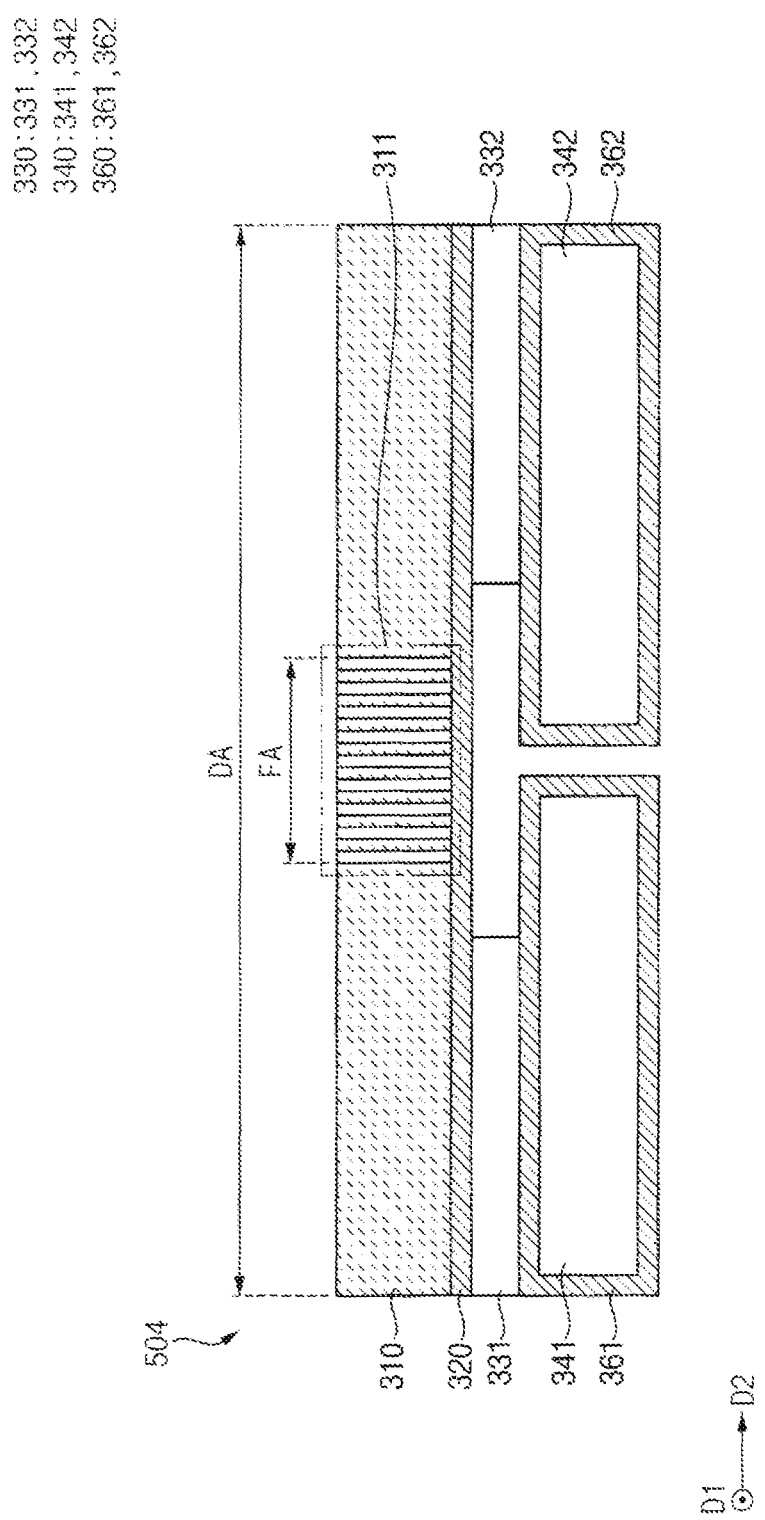

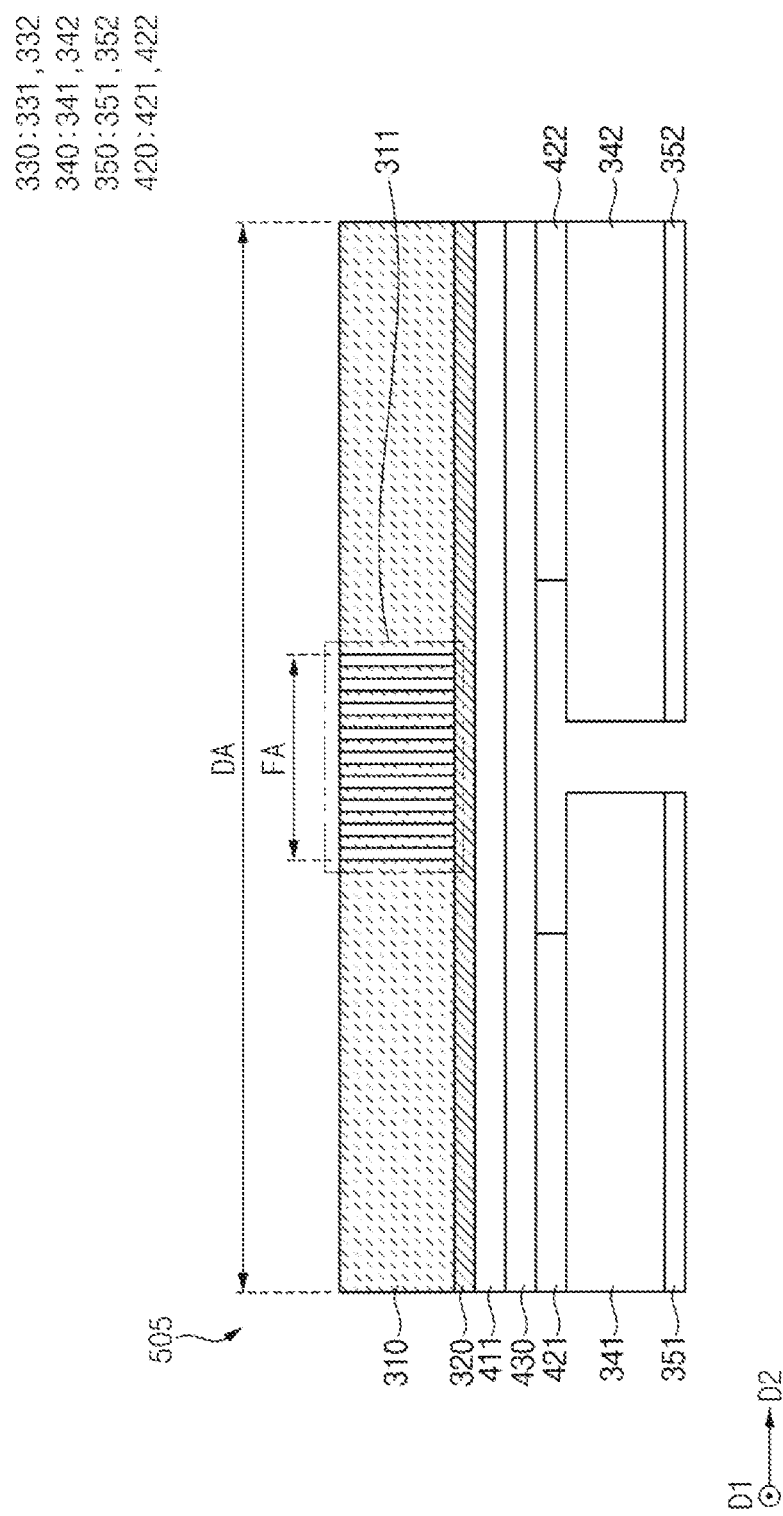

DISPLAY DEVICE

CROSS-REFERENCE TO RELATED APPLICATION

This application claims priority from and the benefit of Korean Patent Application No. 10-2021-0040831, filed on Mar. 30, 2021, which is hereby incorporated by reference for all purposes as if fully set forth herein.

BACKGROUND

Field

Embodiments of the invention relate generally to a display device and more particularly, to a display device having a foldable area.

Discussion of the Background

A flat panel display has been used to replace a cathode ray tube display device due to characteristics of the flat panel display, e.g., lightweight and thinness. Representative examples of such flat panel display devices include a liquid crystal display device and an organic light emitting display device.

Recently, a flexible display device, which includes a lower substrate and an upper substrate of a display panel including a bendable or foldable portion and formed of a flexible material, has been developed. For example, the lower substrate of the display panel may be formed of a polyimide substrate, and the upper substrate of the display panel may have a thin film encapsulation structure.

The above information disclosed in this Background section is only for understanding of the background of the inventive concepts, and, therefore, it may contain information that does not constitute prior art.

SUMMARY

Display devices having a foldable area constructed according to the principles of the invention are capable of improving folding and unfolding operations of the display devices by providing support members, which support a display panel of the display devices and are spaced apart from each other, and capable of enhancing heat dissipation of the display devices by providing heat dissipation members between the display panel and the support members.

Additional features of the inventive concepts will be set forth in the description which follows, and in part will be apparent from the description, or may be learned by practice of the inventive concepts.

According to an aspect of the invention, a display device includes a display panel having a foldable area; a first support member disposed on a lower surface of the display panel and including a stretchable portion overlapping the foldable area; a second support member disposed on a lower surface of the first support member and including a first support plate and a second support plate spaced apart from each other; a first heat dissipation member disposed between the first support member and the second support member and including a first heat dissipation layer and a second heat dissipation layer spaced apart from each other; and a first coating film disposed between the first support member and the first heat dissipation member and including carbon nanotube.

The first coating film may directly contact the lower surface of the first support member.

The first coating film may entirely contact the lower surface of the first support member and cover the stretchable portion.

The display device may further include a second heat dissipation member disposed on a lower surface of the second support member. The second heat dissipation member may include a third heat dissipation layer and a fourth heat dissipation layer spaced apart from each other. The second heat dissipation member may include graphite.

The display device may further include a functional member disposed between the first support member and the second support member. The functional member may include a digitizer and a magnetic member disposed on different layers.

The display device may further include a second coating film disposed on one surface of the second support member. The second coating film may include at least one of a first layer and a second layer spaced apart from each other. The second coating film may include carbon nanotube.

The second coating film may surround at least a portion of the second support member.

Each of the first and second coating films may further include graphene.

The first heat dissipation member may be a thermally conductive tape.

The stretchable portion of the first support member may have a lattice shape in a plan view.

Each of the first support plate and the second support plate may partially overlap the foldable area.

The stretchable portion of the first support member may have a shape extending in a first direction. The stretchable portion may include a plurality of openings arranged in the first direction and s second direction perpendicular to the first direction.

A material included in the first support member and a material included in the second support member may be different from each other.

The first support member may include a stainless steel. The second support member may include a copper alloy.

A material included in the first support member and a material included in the second support member may be same as each other.

Each of the first support member and the second support member may include one selected from a group consisting of a stainless steel, a glass, and a plastic.

According to another aspect of the invention, a display device includes a display panel having a foldable area; a first support member disposed on a lower surface of the display panel and including a stretchable portion overlapping the foldable area; a second support member disposed on a lower surface of the first support member and including a first support plate and a second support plate spaced apart from each other; an elastic member disposed between the first support member and the second support member; and a coating film disposed between the first support member and the elastic member and including carbon nanotube.

The display device may further include a first adhesive member and a second adhesive member. The first adhesive member may be disposed between the coating film and the elastic member. The second adhesive member may be disposed between the elastic member and the second support member and include a first adhesive layer and a second adhesive layer spaced apart from each other. At least one of the first adhesive member, the second adhesive member, and the elastic member may include carbon nanotube.

The coating film directly may contact the lower surface of the first support member.

The coating film entirely may contact the lower surface of the first support member and cover the stretchable portion.

In the display device according to an embodiment, a coating film including carbon nanotube may be disposed between a heat dissipation member and a support member including a stretchable portion overlapping a foldable area. Accordingly, a heat generated from a display panel may be effectively radiated to an outside and be evenly distributed.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 1 is a plan view of an embodiment of a display device constructed according to the principles of the invention illustrating an unfolded state of the display device.

FIG. 2 is a side view illustrating a folded state of the display device of FIG. 1.

FIG. 3 is a cross-sectional view taken along line I-I' of FIG. 1.

FIG. 4 is a plan view illustrating a stretchable portion of a first support member of FIG. 3.

FIGS. 7, 8, 9, 10, and 11 are cross-sectional views of other embodiments of the lower structure of FIG. 3.

DETAILED DESCRIPTION OF THE EMBODIMENTS

Figure 5:
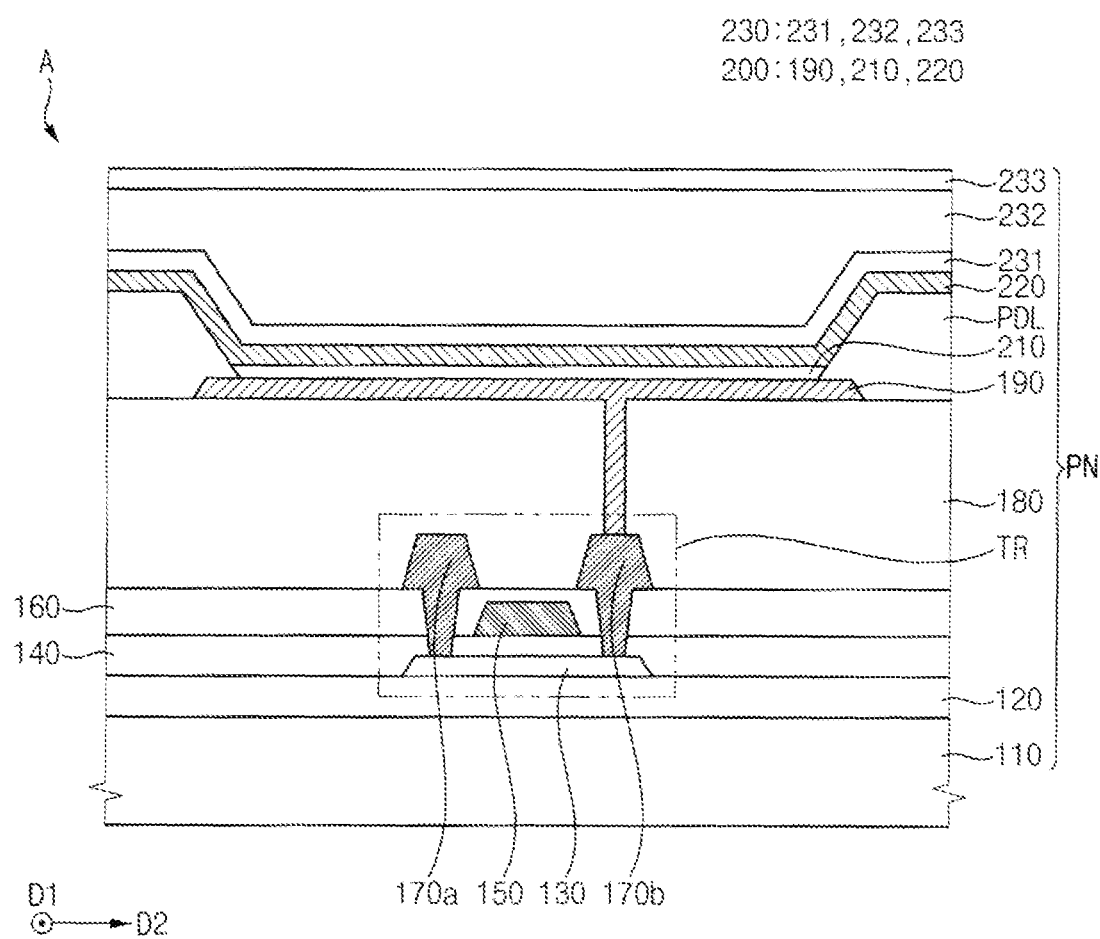
FIG. 5 is an enlarged cross-sectional view of area "A" of FIG. 3.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments will be explained in detail with reference to the accompanying drawings. The same reference numerals are used for the same components in the drawings, and redundant descriptions of the same components will be omitted for descriptive convenience.

FIG. 1 is a plan view illustrating an unfolded state of a display device according to embodiment. FIG. 2 is a side view illustrating a folded state of the display device of FIG. 1.

Referring to FIGS. 1 and 2, the display device 100 may include a display area DA and a peripheral area PA. The display area DA may be referred to as an area for displaying an image. The peripheral area PA may be referred to as an area not for displaying an image. For example, the peripheral area PA may surround at least a portion of the display area DA.

The display device 100 may include a foldable area FA that may be bent by an external force so that the display device 100 may be folded. The foldable area FA may overlap the display area DA. For example, the foldable area FA may have a folding axis extending along a first direction D1.

The display area DA may be divided into a first display area DA1 and a second display area DA2 adjacent to each other in a second direction D2 intersecting the first direction D1. The first display area DA1 and the second display area DA2 may be continuously connected to integrally form one display area DA. For example, when the display area DA is folded along the folding axis, as shown in FIG. 2, the display device 100 may have an inwardly folding structure that the first display area DA1 and the second display area DA2 face each other. Alternatively, when the display area DA is folded along the folding axis, the display device 100 may have an outwardly folding structure that the display area DA is disposed outside or the first display area DA1 and the second display area DA2 are opposite to each other In addition, embodiments are not limited to the display device 100 having a single foldable area. For example, the display device 100 may be folded a plurality of times or may have a plurality of foldable areas to implement a rollable display device.

FIG. 3 is a cross-sectional view taken along line I-I' of FIG. 1. For example, FIG. 3 illustrates the display area DA and the foldable area FA in the unfolded state of the display device 100.

Referring to FIG. 3, the display device 100 may include a window member WN, a polarization member POL, a display panel PN, a lower structure 500, and the like. The lower structure 500 may include a first support member 310, a second support member 340, a first heat dissipation member 330, a second heat dissipation member 350, and a first coating film 320.

The polarization member POL may be disposed on the display panel PN. The polarization member POL may block external light incident from the outside. The window member WN may be disposed on the polarization member POL. The window member WN may have a transmission portion corresponding to the display area DA. For example, the window member WN may include a polymer material, a glass thin film, or combination thereof. For example, the window WN may be bendable.

The first adhesive member 300 may be disposed between the display panel PN and the first support member 310. The first adhesive member 300 may include a first adhesive layer 301 and a second adhesive layer 302 spaced apart from each other. For example, the first adhesive layer 301 and the second adhesive layer 302 of the first adhesive member 300 may be spaced apart from each other in the second direction D2. Each of the first adhesive layer 301 and the second adhesive layer 302 of the first adhesive member 300 may not overlap the foldable area FA. Alternatively, each of the first adhesive layer 301 and the second adhesive layer 302 of the first adhesive member 300 may partially overlap the foldable area FA.

In addition, an upper surface of the first adhesive member 300 may directly contact the display panel PN. A lower surface of the first adhesive member 300 may directly contact the first support member 310. For example, the first adhesive member 300 may include an optical clear adhesive ("OCA"), a pressure sensitive adhesive ("PSA"), a photocurable resin, a thermosetting resin, or the like.

The first support member 310 may be disposed on the upper surface of the display panel PN. In an embodiment, the first support member 310 may include a stretchable portion 311 overlapping the foldable area FA. The stretchable portion 311 may have elasticity or flexibility capable of performing the folding and unfolding operations of the display device 100. The stretchable portion 311 may have a lattice shape. However, although it is illustrated in FIG. 3 that the stretchable portion 311 is a single portion, embodiments are not limited thereto. For example, the stretchable portion 311 may be formed in plurality. A detailed configuration of the stretchable portion 311 will be described later.

The first support member 310 may support the display panel PN and may also assist the display panel PN to be folded. For example, the first support member 310 may be entirely disposed on the lower surface of the display panel PN to support the display panel PN. The stretchable portion 311 overlapping the foldable area FA may help the display panel PN to be folded.

The second support member 340 may be disposed on the lower surface of the first support member 310. The second support member 340 may include a first support plate 341 and a second support plate 342 spaced apart from each other. For example, the second support member 340 may include a first support plate 341 and a second support plate 342 spaced apart from each other in the second direction D2. Each of the first support plate 341 and the second support plate 342 of the second support member 340 may partially overlap the foldable area FA.

For example, when the display device 100 is folded, a distance between the first support plate 341 and the second support plate 342 of the second support member 340 may increase. The second support member 340 may prevent the stretchable portion 311 of the first support member 310 from being pressed. The second support member 340 may radiate or dissipate heat generated from the display panel PN to the outside and may evenly distribute the heat.

A material included in the first support member 310 and a material included in the second support member 340 may be different from each other. In an embodiment, the first support member 310 and the second support member 340 may include different alloys. For example, the first support member 310 may include stainless steel ("SUS"), and the second support member 340 may include a copper alloy. Alternatively, each of the first support member 310 and the second support member 340 may include different glass or plastic.

A material included in the first support member 310 and a material included in the second support member 340 may be the same as each other. In an embodiment, each of the first and second support members 310 and 340 may include stainless steel, glass, or plastic. For example, each of the first and second support members 310 and 340 may include stainless steel-303, stainless steel-304, stainless steel-316, and the like. Alternatively, each of the first and second support members 310 and 340 may include glass fiber reinforced plastic ("GFRP"), carbon fiber reinforced plastic ("CFRP"), and the like.

In an embodiment, a first coating film 320 including carbon nanotube ("CNT") may be disposed between the first support member 310 and the second support member 340. The first coating film 320 may cover the stretchable portion 311 of the first support member 310. In addition, the first coating film 320 may directly contact the lower surface of the first support member 310. For example, the first coating film 320 may entirely contact the lower surface of the first support member 310. In addition, a thickness of the first coating film 320 may be about 2 μm to about 50 μm. For example, the thickness of the first coating film 320 may be about 10 μm. Accordingly, heat generated from the display panel PN may be effectively radiated or dissipated to the outside and may be evenly distributed.

The first coating film 320 may further include a material having high thermal conductivity. In an embodiment, the first coating film 320 may further include graphene. The thermal conductivity of the carbon nanotube is about 3,000 W/mK to about 6,000 W/mK, and the thermal conductivity of the graphene is about 4,800 W/mK to about 5,300 W/mK. For example, the thermal conductivity of the graphene is higher than the thermal conductivity of the carbon nanotube. Accordingly, heat generated from the display panel PN may be more effectively radiated or dissipated to the outside and may be evenly distributed.

The first coating film 320 may be formed by a method such as a spray coating process, a bar coating process, a screen printing process, or a dip coating process.

In an embodiment, the first heat dissipation member 330 may be disposed between the first coating film 320 and the second support member 340. The first heat dissipation member 330 may include a first heat dissipation layer 331 and a second heat dissipation layer 332 spaced apart from each other. For example, the first heat dissipation member 330 may include the first heat dissipation layer 331 and the second heat dissipation layer 332 spaced apart from each other in the second direction D2. Each of the first heat dissipation layer 331 and the second heat dissipation layer 332 of the first heat dissipation member 330 may not overlap the foldable area FA. Alternatively, each of the first heat dissipation layer 331 and the second heat dissipation layer 332 of the first heat dissipation member 330 may partially overlap the foldable area FA.

In an embodiment, the first heat dissipation member 330 may be a thermally conductive tape. For example, the first heat dissipation member 330 may be a double-sided adhesive tape including a material having high thermal conductivity. For example, the first heat dissipation member 330 may include an adhesive polymer resin and the like.

The second heat dissipation member 350 may be disposed on a lower surface of the second support member 340. The second heat dissipation member 350 may include a third heat dissipation layer 351 and a fourth heat dissipation layer 352 spaced apart from each other. For example, the second heat dissipation member 350 may include the third heat dissipation layer 351 and the fourth heat dissipation layer 352 spaced apart from each other in the second direction D2. In addition, an upper surface of the third heat dissipation layer 351 may contact the first support plate 341, and an upper surface of the fourth heat dissipation layer 352 may contact the second support plate 342. Each of the third heat dissipation layer 351 and the fourth heat dissipation layer 352 of the second heat dissipation member 350 may partially overlap the foldable area FA. For example, the second heat dissipation member 350 may include a material having high thermal conductivity. In an embodiment, the second heat dissipation member 350 may include graphite. However, embodiments are not limited thereto, and the second heat dissipation member 350 may include aluminum (Al), copper (Cu), and the like.

FIG. 4 is a plan view illustrating a stretchable portion of a first support member 310 of FIG. 3.

Referring to FIG. 4, the first support member 310 may include the stretchable portion 311 having a lattice shape. For example, the stretchable portion 311 may include a plurality of openings 311*a* and 311*b*. In an embodiment, the plurality of openings 311*a* and 311*b* may have a shape extending in the first direction D1 and may be arranged in the first direction D1 and the second direction D2 substantially perpendicular to the first direction D1. For example, the plurality of openings 311*a* and 311*b* may have a rectangular shape. However, embodiments are not limited thereto. For example, the plurality of openings 311*a* and 311*b* may have a polygon shape or an ellipse shape. In addition, the second openings 311*b* adjacent to the first openings 311*a* in the second direction D2 may be shifted from the first openings 311*a* in the second direction D2 so that the plurality of openings 311*a* and 311*b* form an overall staggered arrangement. For example, the plurality of openings 311a and 311b may be arranged in a zig-zag shape.

FIG. 5 is an enlarged cross-sectional view of area "A" of FIG. 3.

Referring to FIG. 5, the display panel PN may include a substrate 110, a buffer layer 120, a gate insulating layer 140, a transistor TR, an interlayer insulating layer 160, a planarization layer 180, a pixel defining layer PDL, an emission element 200, an encapsulation layer 230, and the like. The transistor TR may include an active layer 130, a gate electrode 150, a source electrode 170a and a drain electrode 170b. The emission element 200 may include a lower electrode 190, an emission layer 210, and an upper electrode 220. The encapsulation layer 230 may include a first thin film encapsulation layer 231, a second thin film encapsulation layer 232, and a third thin film encapsulation layer 233.

The substrate 110 may include a transparent material or an opaque material. The substrate 110 may include a flexible transparent resin substrate. An example of the transparent resin substrate that can be used as the substrate 110 may be a polyimide substrate. Alternatively, the substrate 110 may include a quartz substrate, a synthetic quartz substrate, a calcium fluoride substrate, a soda lime glass substrate, an alkali-free glass substrate, and the like.

The buffer layer 120 may be disposed on the substrate 110. The buffer layer 120 may prevent diffusion of metal atoms or impurities from the substrate 110 to the transistor TR. For example, the buffer layer 120 may include an inorganic material such as oxide or nitride.

The active layer 130 may be disposed on the buffer layer 120. The active layer 130 may include a metal oxide semiconductor, an inorganic semiconductor (e.g., amorphous silicon, polysilicon), or an organic semiconductor. The active layer 130 may have a source region and a drain region.

The gate insulating layer 140 may be disposed on the buffer layer 120. The gate insulating layer 140 may cover the active layer 130 on the substrate 110 and may have a substantially flat top surface without forming a step around the active layer 130. Alternatively, the gate insulating layer 140 may cover the active layer 130 on the substrate 110 and may be disposed along a profile of the active layer 130 with a substantially constant thickness. For example, the gate insulating layer 140 may include silicon oxide ($SiO_x$), silicon nitride ($SiN_x$), silicon carbide ($SiC_x$), silicon oxynitride ($SiO_xN_y$), silicon oxycarbide ($SiO_xC_y$), and the like.

The gate electrode 150 may be disposed on the gate insulating layer 140. The gate electrode 150 may overlap the active layer 130. For example, the gate electrode 150 may include a metal, an alloy, a metal nitride, a conductive metal oxide, a transparent conductive material, and the like. These may be used alone or in combination with each other.

The interlayer insulating layer 160 may be disposed on the gate insulating layer 140. The interlayer insulating layer 160 may cover the gate electrode 150 on the substrate 110 and may have a substantially flat top surface without creating a step around the gate electrode 150. Alternatively, the interlayer insulating layer 160 may cover the gate electrode 150 on the substrate 110 and may be disposed along a profile of the gate electrode 150 with a uniform thickness. For example, the interlayer insulating layer 160 may include silicon oxide ($SiO_x$), silicon nitride ($SiN_x$), silicon carbide ($SiC_x$), silicon oxynitride ($SiO_xN_y$), silicon oxycarbide ($SiO_xC_y$), and the like.

The source electrode 170a and the drain electrode 170b may be disposed on the interlayer insulating layer 160. The source electrode 170a may be connected to the source region of the active layer 130 through a contact hole formed by removing a first portion of the gate insulating layer 140 and the interlayer insulating layer 160. The drain electrode 170b may be connected to the drain region of the active layer 130 through a contact hole formed by removing a second portion of the gate insulating layer 140 and the interlayer insulating layer 160. For example, each of the source electrode 170a and the drain electrode 170b may include a metal, an alloy, a metal nitride, a conductive metal oxide, a transparent conductive material, and the like. These may be used alone or in combination with each other.

The planarization layer 180 may be disposed on the interlayer insulating layer 160. The planarization layer 180 may cover the source electrode 170a and the drain electrode 170b. The planarization layer 180 may include an organic material or an inorganic material. For example, the planarization layer 180 may include an organic material such as a polyimide-based resin, a photoresist, a polyacryl-based resin, a polyimide-based resin, a siloxane-based resin, a siloxane-based resin, and the like.

The lower electrode 190 may be disposed on the planarization layer 180. The lower electrode 190 may be connected to the drain electrode 170b through a contact hole formed by removing a portion of the planarization layer 180. For example, the lower electrode 190 may include a metal, an alloy, a metal nitride, a conductive metal oxide, a transparent conductive material, and the like. These may be used alone or in combination with each other.

The pixel defining layer PDL may be disposed on the planarization layer 180. The pixel defining layer PDL may include an opening exposing a portion of the lower electrode 190. The pixel defining layer PDL may include an organic material or an inorganic material. For example, the pixel defining layer PDL may include an organic material such as polyimide.

The emission layer 210 may be disposed on the lower electrode 190. The emission layer 210 may be disposed on the lower electrode 190 exposed by the opening. The emission layer 210 may have a multilayer structure including an organic emission layer, a hole injection layer, a hole transport layer, an electron transport layer, an electron injection layer, and the like. The organic emission layer may be formed of at least one of light emitting materials capable of emitting red light, green light, and blue light. Alternatively, the organic emission layer may emit white light as a whole by stacking a plurality of light emitting materials capable of generating different color lights such as red light, green light, and blue light.

The upper electrode 220 may be disposed on the pixel defining layer PDL and the emission layer 210. The upper electrode 220 may be entirely disposed in the display area DA shown in FIG. 1. For example, the upper electrode 220 may include a metal, an alloy, a metal nitride, a conductive metal oxide, a transparent conductive material, and the like. These may be used alone or in combination with each other.

The first thin film encapsulation layer 231 may be disposed on the upper electrode 220. The first thin film encapsulation layer 231 may prevent the emission layer 210 from being deteriorated due to penetration of moisture, oxygen, and the like. In addition, the first thin film encapsulation layer 231 may protect the display panel PN from external impact. The first thin film encapsulation layer 231 may include flexible inorganic materials.

The second thin film encapsulation layer 232 may be disposed on the first thin film encapsulation layer 231. The second thin film encapsulation layer 232 may improve the flatness of the display panel PN and protect the display panel PN. The second thin film encapsulation layer 232 may include flexible organic materials.

The third thin film encapsulation layer 233 may be disposed on the second thin film encapsulation layer 232. The third thin film encapsulation layer 233 and the first thin film encapsulation layer 231 may prevent the emission layer 210 from being deteriorated due to penetration of moisture, oxygen, and the like. In addition, the third thin film encapsulation layer 233 may protect the display panel PN together with the first thin film encapsulation layer 231 and the second thin film encapsulation layer 232 from external impact. The third thin film encapsulation layer 233 may include flexible inorganic materials.

Figure 6:
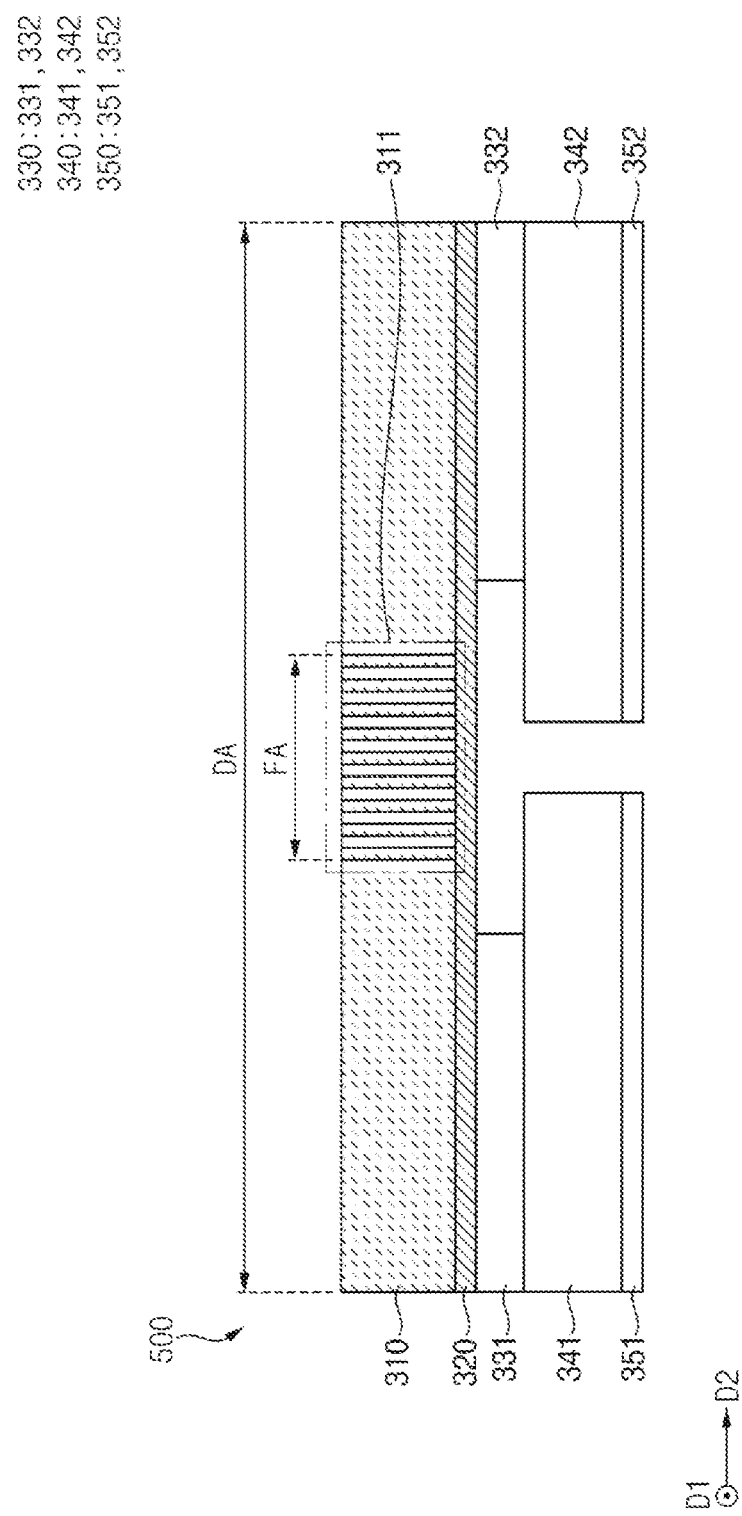
FIG. 6 is a cross-sectional view of an embodiment of a lower structure of FIG. 3.

FIG. 6 is a cross-sectional view illustrating an example of the lower structure 500 of FIG. 3.

Referring to FIG. 6, the lower structure 500 may include the first support member 310, the second support member 340, the first coating film 320, the first heat dissipation member 330, and the second heat dissipation member 350. As described above, referring to FIG. 3, the first coating film 320 may be disposed on the lower surface of the first support member 310, and the first heat dissipation member 330 may be disposed between the first coating film 320 and the second support member 340.

FIGS. 7, 8, 9, 10, and 11 are cross-sectional views illustrating other embodiments of the lower structure 500 of the display device 100 of FIG. 3.

Figure 7:
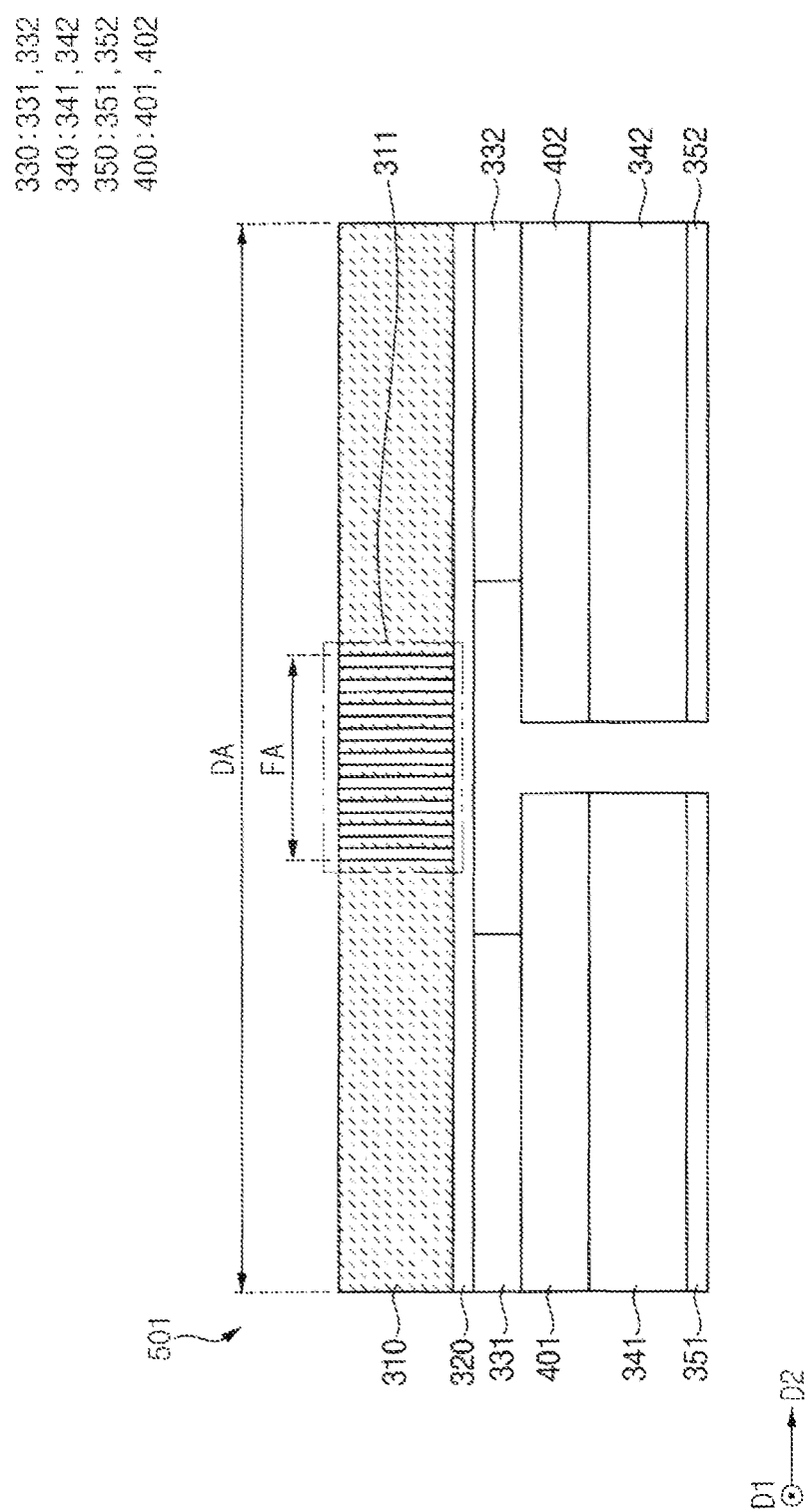

Referring to FIG. 7, the lower structure 501 may include the first support member 310, the second support member 340, the first coating film 320, a functional member 400, the first heat dissipation member 330 and the second heat dissipation members 350. However, the lower structure 501 of FIG. 7 may be substantially the same as or similar to the lower structure 500 described with reference to FIGS. 3 and 6, except that the functional member 400 is further included. Hereinafter, redundant descriptions will be omitted for descriptive convenience.

In an embodiment, the functional member 400 may be disposed between the first heat dissipation member 330 and the second support member 340. The functional member 400 may include a first functional layer 401 and a second functional layer 402. For example, the functional member 400 may include the first functional layer 401 and the second functional layer 402 spaced apart from each other in the second direction D2. Each of the first functional layer 401 and the second functional layer 402 of the functional member 400 may partially overlap the foldable area FA. Alternatively, each of the first functional layer 401 and the second functional layer 402 of the functional member 400 may not overlap the foldable area FA.

The functional member 400 may include a digitizer and a magnetic member. The digitizer and the magnetic member may be disposed on different layers. For example, the digitizer may be disposed on the magnetic member. In addition, each of the first functional layer 401 and the second functional layer 402 may include the digitizer and the magnetic member.

The digitizer may be a device for converting coordinates of input devices into digital data when the input devices (e.g., a pen) contacts the screen of the display device 100. For example, the digitizer may use an electromagnetic resonance ("EMR") method. The magnetic member may induce electromagnetic resonance when the input devices approaches the screen of the display device 100. For example, the magnetic member may include magnetic powder.

For example, a coating film including carbon nanotube may be disposed on the functional member 400. For example, a lower surface of the coating film may directly contact the functional member 400. Accordingly, a heat generated from the display panel PN may be more effectively radiated or dissipated to the outside and may be evenly distributed.

Figure 8:
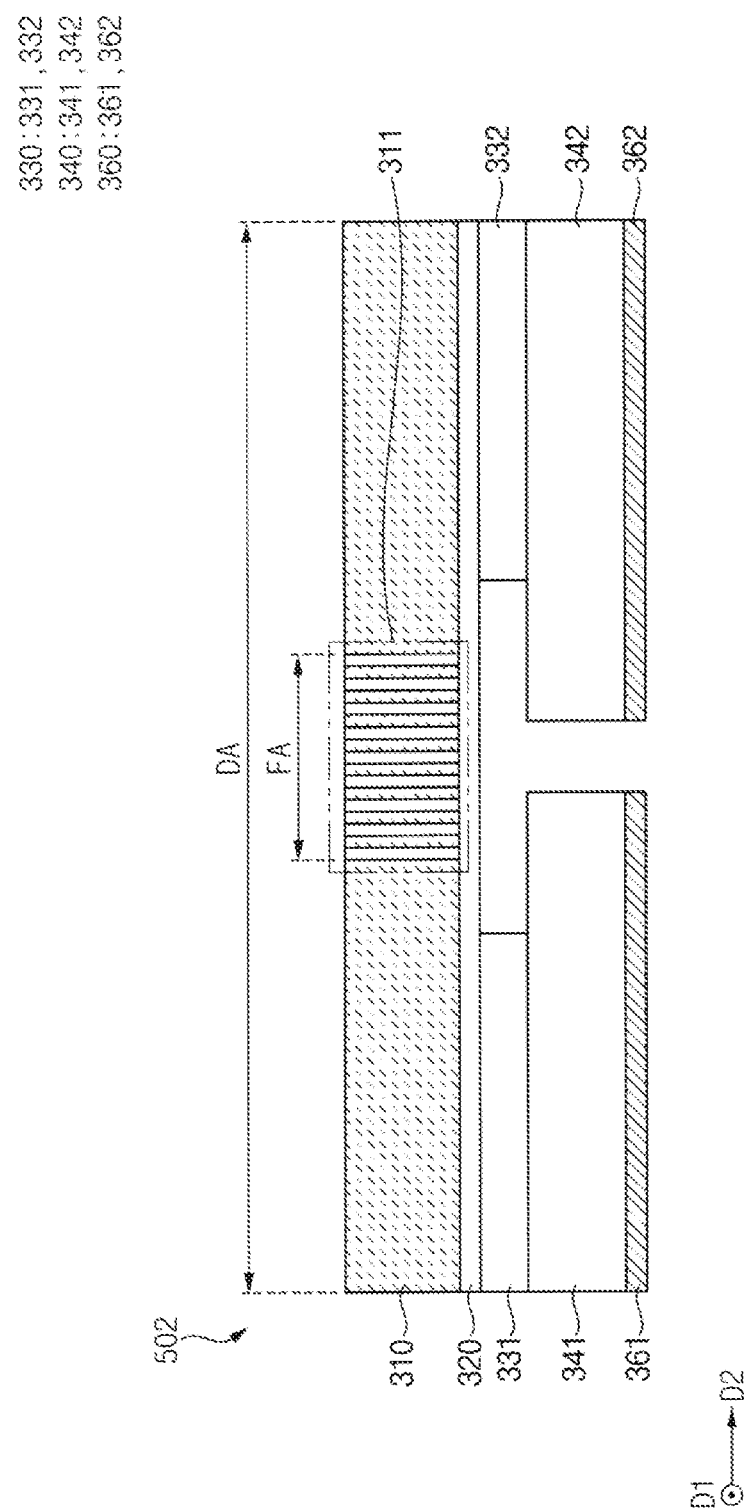

Referring to FIGS. 8, 9 and 10, the lower structures 502, 503, and 504 may include the first support member 310, the second support member 340, the first coating film 320, a second coating film 360, and the first heat dissipation member 330. However, the lower structures 502, 503, and 504 of FIGS. 8, 9 and 10 may be substantially the same as the lower structures 500 described with reference to FIGS. 3 and 6 except for the second coating film 360. Hereinafter, redundant descriptions will be omitted for descriptive convenience.

In an embodiment, the second coating film 360 may include the same material as the first coating film 320, and may be disposed on one surface of the second support member 340. For example, the second coating film 360 including carbon nanotubes may be disposed on the one surface of the second support member 340. In other words, the second heat dissipation member 350 shown in FIG. 6 may be omitted, and the second coating film 360 including carbon nanotubes may be disposed on one surface of the second support member 340. In addition, the first coating film 320 may further include a material having high thermal conductivity. In an embodiment, the first coating film 320 may further include graphene. Accordingly, a heat generated from the display panel PN may be more effectively radiated or dissipated to the outside and may be evenly distributed.

The second coating film 360 may include at least one of a first layer 361 and a second layer 362 spaced apart from each other. For example, the second coating film 360 may include at least one of the first layer 361 and the second layer 362 spaced apart from each other in the second direction D2.

Referring to FIG. 8, the first layer 361 and the second layer 362 of the second coating film 360 may be disposed on the lower surface of the second support member 340. Referring to FIG. 9, only the first layer 361 of the second coating film 360 may be disposed on the lower surface of the second support member 340. Alternatively, only the second layer 362 of the second coating film 360 may be disposed on the lower surface of the second support member 340. In an embodiment, an upper surface of the first layer 361 may directly contact the first support plate 341, and an upper surface of the second layer 362 may directly contact the second support plate 342.

Referring to FIG. 10, the second coating film 360 may surround at least a portion of the second support member 340. In an embodiment, the second coating film 360 may surround the whole of the second support member 340. For example, the first layer 361 may surround the whole of the first support plate 341 and the second layer 362 may surround the whole of the second support plate 342. In other words, the first layer 361 may entirely contact the first support plate 341 and the second layer 362 may entirely contact the second support plate 342.

The second coating film 360 may be formed in the same manner as the first coating film 320. For example, the second coating film 360 may be formed by a method such as a spray coating process, a bar coating process, a screen printing process, and a dip coating process.

Referring to FIG. 11, the lower structure 505 may include the first support member 310, the second support member 340, the first coating film 320, a second adhesive member 411, a third adhesive member 420, an elastic member 430, and the second heat dissipation member 350. However, the lower structure 505 of FIG. 11 may be substantially the same as the lower structure 500 described with reference to FIGS. 3 and 6 except for the second adhesive member 411, the third adhesive member 420, and the elastic member 430. Hereinafter, redundant descriptions will be omitted for descriptive convenience.

The elastic member 430 may be disposed between the first support member 310 and the second support member 340. For example, the elastic member 430 may be disposed to overlap the foldable area FA. While the display device 100 repeatedly performs folding and unfolding, the elastic member 430 may prevent foreign substances from penetrating into the stretchable portion 311. In addition, while the display device 100 repeatedly performs the folding and unfolding operations, the elastic member 430 may be stretched and contracted so as not to expose the stretchable portion 311. For example, the elastic member 430 may include an elastic polymer having a relatively large elastic force or a relatively large restoring force. For example, the elastic member 430 may include an elastic material such as silicone, urethane, thermoplastic poly urethane ("TPU"), and the like.

The second adhesive member 411 may be disposed between the first coating film 320 and the elastic member 430. The upper surface of the second adhesive member 411 may directly contact the first coating film 320 and the lower surface of the second adhesive member 411 may directly contact the elastic member 430.

The third adhesive member 420 may be disposed between the elastic member 430 and the second support member 340. The third adhesive member 420 may include a third adhesive layer 421 and a fourth adhesive layer 422 spaced apart from each other. For example, the third adhesive member 420 may include the third adhesive layer 421 and the fourth adhesive layer 422 spaced apart from each other in the second direction D2. Each of the third adhesive layer 421 and the fourth adhesive layer 422 of the third adhesive member 420 may not overlap the foldable area FA. The third adhesive layer 421 may attach between the elastic member 430 and the first support plate 341. The fourth adhesive layer 422 may attach between the elastic member 430 and the second support plate 342. For example, each of the second and third adhesive members 411 and 420 may include an optically transparent adhesive, a pressure-sensitive adhesive, a photocurable resin, or a thermosetting resin.

In an embodiment, at least one of the second adhesive member 411, the third adhesive member 420, and the elastic member 430 may include carbon nanotube.

In addition, the second heat dissipation member 350 may not be disposed on the lower surface of the second support member 340. For example, the second heat dissipation member 350 may be omitted, and the second coating film 360 shown in FIG. 8 may be disposed on the lower surface of the second support member 340.

However, although the display device 100 is described by limiting the organic light emitting display device, embodiments are not limited thereto. For example, the display device 100 may include a liquid crystal display device ("LCD"), a field emission display device ("FED"), a plasma display device ("PDP"), or an electrophoretic display device ("EPD").

The embodiments may be applied to a display device and an electronic device including the same. For example, the embodiments may be applied to high-resolution smartphones, mobile phones, smart pads, smart watches, tablet PCs, vehicle navigation systems, televisions, computer monitors, notebook computers, and the like.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display panel having a foldable area;
   a first support member disposed on a lower surface of the display panel and comprising a stretchable portion overlapping the foldable area;
   a second support member disposed on a lower surface of the first support member and comprising a first support plate and a second support plate spaced apart from each other;
   a first heat dissipation member disposed between the first support member and the second support member and comprising a first heat dissipation layer and a second heat dissipation layer spaced apart from each other; and
   a first coating film disposed between the first support member and the first heat dissipation member and comprising carbon nanotube, wherein the first coating film entirely contacts the lower surface of the first support member and covers the stretchable portion.

2. The display device of claim 1, wherein the first coating film directly contacts the lower surface of the first support member.

3. The display device of claim 1, further comprising:
   a second heat dissipation member disposed on a lower surface of the second support member and comprising a third heat dissipation layer and a fourth heat dissipation layer spaced apart from each other,
   wherein the second heat dissipation member comprises graphite.

4. The display device of claim 1, further comprising:
   a functional member disposed between the first support member and the second support member and comprising a digitizer and a magnetic member disposed on different layers.

5. The display device of claim 1, further comprising:
   a second coating film disposed on one surface of the second support member, comprising at least one of a first layer and a second layer spaced apart from each other, and comprising carbon nanotube.

6. The display device of claim 5, wherein the second coating film surrounds at least a portion of the second support member.

7. The display device of claim 5, wherein each of the first and second coating films further comprises graphene.

8. The display device of claim 1, wherein the first heat dissipation member is a thermally conductive tape.

9. The display device of claim 1, wherein the stretchable portion of the first support member has a lattice shape in a plan view.

10. The display device of claim 1, wherein each of the first support plate and the second support plate partially overlaps the foldable area.

11. The display device of claim 1, wherein the stretchable portion of the first support member has a shape extending in a first direction and comprises a plurality of openings arranged in the first direction and s second direction substantially perpendicular to the first direction.

12. The display device of claim 1, wherein a material included in the first support member and a material included in the second support member are different from each other.

13. The display device of claim 12, wherein:
the first support member comprises a stainless steel, and
the second support member comprises a copper alloy.

14. The display device of claim 1, wherein a material included in the first support member and a material included in the second support member are same as each other.

15. The display device of claim 14, wherein each of the first support member and the second support member comprises one of stainless steel, glass, and plastic.

* * * * *